US008291351B2

(12) United States Patent
Lei et al.

(10) Patent No.: US 8,291,351 B2
(45) Date of Patent: Oct. 16, 2012

(54) INTELLIGENT PATTERN SIGNATURE BASED ON LITHOGRAPHY EFFECTS

(75) Inventors: Junjiang Lei, Bellevue, WA (US); Kuang-Hao Lay, Mountain View, CA (US); Srini Doddi, Fremont, CA (US); Weiping Fang, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/151,208

(22) Filed: Jun. 1, 2011

(65) Prior Publication Data

US 2011/0239168 A1 Sep. 29, 2011

Related U.S. Application Data

(62) Division of application No. 11/952,912, filed on Dec. 7, 2007, now Pat. No. 7,966,586.

(51) Int. Cl.
*G06F 17/50* (2006.01)

(52) U.S. Cl. ............................ 716/51; 716/55; 716/132

(58) Field of Classification Search ........................ None
See application file for complete search history.

(56) References Cited

U.S. PATENT DOCUMENTS

| | | | | |
|---|---|---|---|---|
| 7,155,698 | B1 * | 12/2006 | Gennari | 716/53 |
| 7,418,693 | B1 * | 8/2008 | Gennari et al. | 716/55 |
| 7,512,927 | B2 * | 3/2009 | Gallatin et al. | 716/51 |
| 7,695,876 | B2 * | 4/2010 | Ye et al. | 430/30 |
| 7,707,542 | B1 * | 4/2010 | Gennari et al. | 716/50 |
| 7,818,707 | B1 * | 10/2010 | Gennari et al. | 716/53 |

OTHER PUBLICATIONS

Gennari et al., "A Pattern Matching System for Linking TCAD and EDA," 2004 Proc. 5$^{th}$ Int'l Symposium on Quality Electronic Design, pp. 165-170.*

* cited by examiner

*Primary Examiner* — Leigh Garbowski
(74) *Attorney, Agent, or Firm* — Vista IP Law Group, LLP

(57) ABSTRACT

The present invention is directed to an improved method, system, and computer program product for accessing and analyzing patterns in the integrated circuit design. The method, system or computer program product includes generating an intelligent signature for a pattern. The derived pattern signature is an intelligent pattern identifier because it retains only essential information about a pattern that corresponds to lithography printable portions of the pattern. Accordingly, one pattern signature can represent a group of design patterns that are equivalents from a lithography perspective.

10 Claims, 6 Drawing Sheets

Sample pattern with n x n points
$(x_j, y_k)$ j, k=1, 2, . .., n
502

Form matrix a = $\{a_{jk}\}$ by calculating filtered function values for sampling points
$a_{jk} = g(x_j, y_k)$
504

Calculate eigenvalues $\{\lambda_j\}$ of A; use one or more eigenvalues as signature 506 of pattern
508

INTELLIGENT PATTERN SIGNATURE BASED ON LITHOGRAPHY EFFECTS

CROSS-REFERENCE TO RELATED APPLICATION(S)

The instant application constitutes a division of and thereby claims the benefit of U.S. application Ser. No. 11/952,912, now U.S. Pat. No. 7,966,586, filed on Dec. 7, 2007, entitled "INTELLIGENT PATTERN SIGNATURE BASED ON LITHOGRAPHY EFFECTS", the content of which is hereby expressly incorporated by reference in its entirety.

BACKGROUND

In the Integrated Circuit (IC) design, electronic components and wiring are represented by a set of geometric shapes and patterns from a physical perspective. Electronic design automation (EDA) tools interact with these shapes and patterns throughout the IC design and verification process. For example, the patterns and shapes in the design are routinely checked with the Design Rules—Design Rules Checking (DRC). Design rules are a series of parameters provided by semiconductor manufacturers, specifying geometric and connectivity restrictions to ensure sufficient margins to account for variability in semiconductor manufacturing processes. DRC enables a designer to verify the correctness of his or her design and to achieve a high overall yield and reliability for the design.

However, when the lithography process reaches 65 nm and below, mere reliance on DRC may no longer be sufficient to ensure acceptable yields. One solution is the application of Lithography Process Checking (LPC). LPC simulates the actual lithography process on the design data to predict the eventual printed pattern on a silicon wafer. But lithography simulations are often costly and time-consuming. It is highly desirable to limit the number of simulations that must be performed for each design process. Patterns and shapes previously verified by lithography simulations could be stored in a database for the future use. When an EDA tool encounters a pattern, it may search the database for a matched pattern before conducting the expensive lithography simulations. If the search result turns out to be positive, no simulation will be needed for this pattern. Pattern analysis and matching play an important role in this approach. An intelligent pattern identifier can greatly improve the efficiency of the whole LPC process.

SUMMARY OF THE INVENTION

The present invention is directed to an improved method, system, and computer program product for accessing and analyzing patterns in the IC design. According to some embodiments, a new method, system and computer program product are disclosed for generating an intelligent signature for a pattern. The pattern signature is an intelligent pattern identifier because it retains only essential information about a pattern that corresponds to lithography printable portions of the pattern. Accordingly, one pattern signature can represent a group of design patterns that are equivalents from a lithography perspective.

Other and additional objects, features, and advantages of the invention are described in the detailed description, figures, and claims.

DETAILED DESCRIPTION

The present invention is directed to an improved method, system and computer program product for accessing and analyzing patterns in an IC design.

Figure 1:
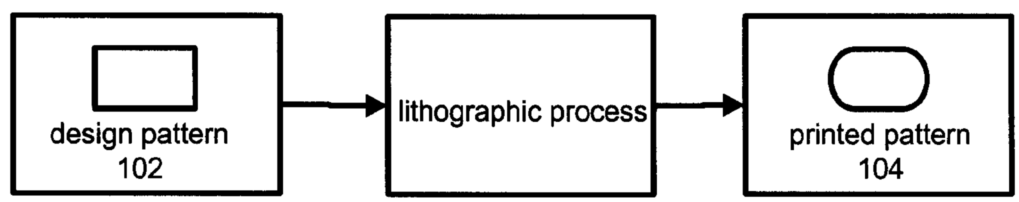
FIG. 1 illustrates the filtering effects of lithography process

Embodiments of the present invention implement representations of design patterns in an intelligent manner, where the representation itself is capable of providing additional information about the pattern. In these embodiments, the pattern representation is capable of accounting for lithography effects and can be used to represent the anticipated "as-printed" details of the pattern. To explain, it is noted that due to optical effects of the manufacturing process, a lithographically printed pattern often will not retain some geometric details of the original design pattern. As illustrated in FIG. 1, sharp corners in a design pattern 102 may disappear after being lithographically printed, as shown by printed pattern 104. One embodiment would utilize a pattern signature for the pattern 102 where the signature represents and provides information about the expected printed pattern 104. Therefore, the signature for a design pattern is considered "intelligent" because it retains only essential information about a pattern that corresponds to lithography printable portions of the pattern.

A group of design patterns that are geometrically different may in fact be similar from a lithography perspective. Therefore, it is possible that multiple patterns may share the same or similar pattern signature due to their expected same/similar printed patterns even though their original patterns are different. Using the intelligent pattern signature, design patterns that are lithography-process equivalent will be assigned a single pattern signature and be treated as the same pattern. As such, not only the number of lithography simulations but the size of the database for storing verified patterns will be reduced significantly because only one simulation is required for a group of design patterns. In addition, the intelligent signature often consists of a set of parameters. Pattern matching based on a set of parameters is much easier to realize than those based on direct mathematical representations because the latter often involve complex forms of parameters.

Figure 2:
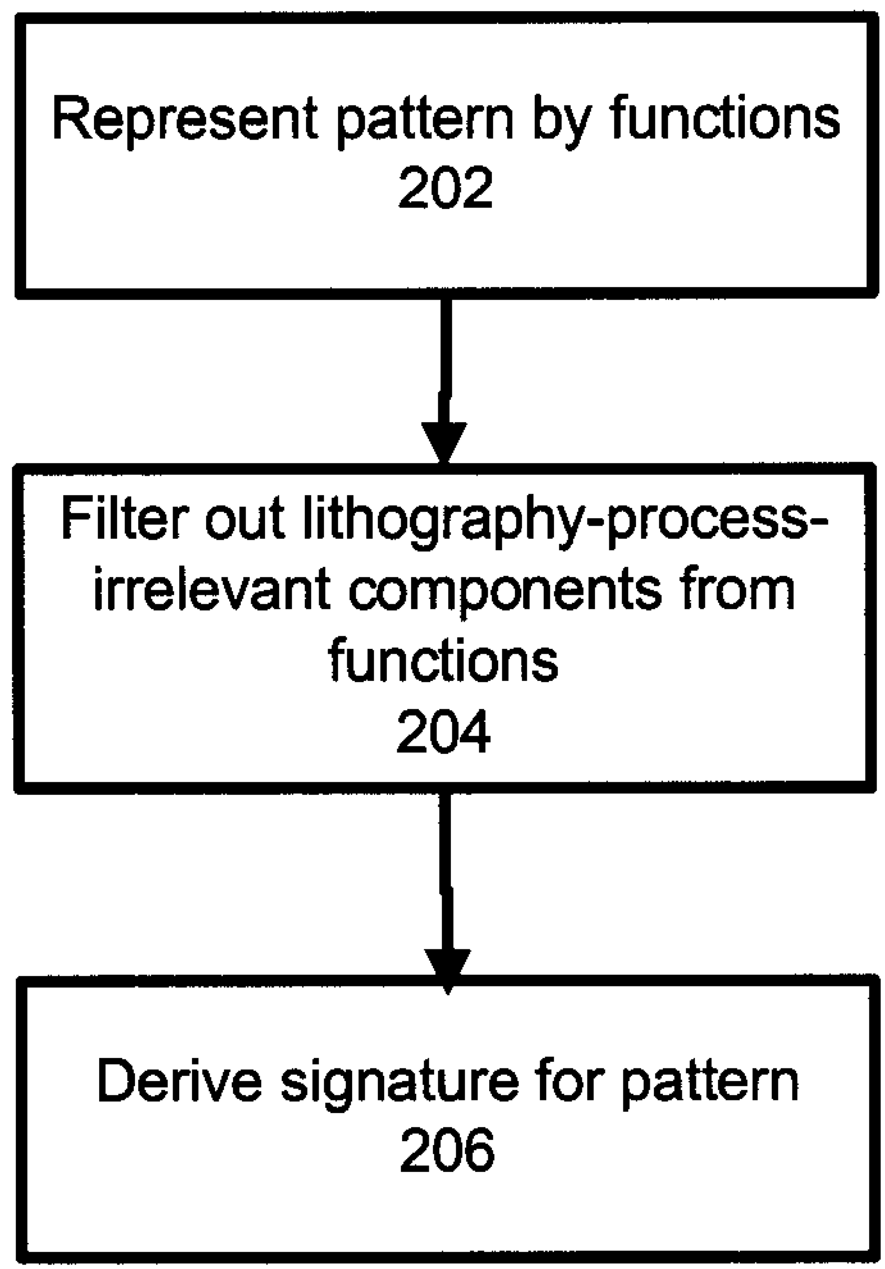
FIG. 2 shows a flowchart of an implementation of an approach for generating intelligent pattern identifiers

FIG. 2 shows a flowchart of an implementation of an approach for generating the intelligent pattern signature. To generate the intelligent pattern signature, mathematical approaches are employed to extract information corresponding to lithography-printable portions of a design pattern. The lithography-printable portions refer to geometric features of the pattern that will survive a lithography process. Based on the extracted information, the intelligent signature can be derived.

To realize such a process, a design pattern is first represented by functions (202). In one embodiment, the pattern may be divided into a group of basic geometric shapes such as rectangles and squares, and these shape are represented by simple functions. While other types of functions could be used, both function representation and mathematical transformations are relatively easy to perform with simple functions. After the design pattern is represented by functions, mathematical transformations are employed to extract lithography-printable information (204). As illustrated in FIG. 1, some geometric details of the original pattern 102 (e.g. sharp corners for a rectangle) often disappear during a lithography process. These geometric details usually correspond to the high frequency portions of the function that represents the design pattern. Thus, the lithography process in effect works as a low-pass filter. Mathematical transformations could be utilized to perform such a filtering process to derive a function that retains low-frequency components. In some embodiments, the initial function representing a design pattern may be transformed into a frequency domain, where the high-frequency components will be removed. The remaining portion is then inverse-transformed back into the spatial domain and becomes the filtered function for the pattern.

With the filtered function, the intelligent pattern signature can then be generated (206). In some embodiments, a matrix representation may be derived by sampling the pattern and calculating the values of the filtered function for every sampling points. One or more of the eigenvalues for the matrix are then calculated and designated as the pattern signature. The matrix retains mainly the lithography-printable information because it is derived by employing the filtered function. As a result, different design patterns that are equivalent from a lithography perspective will generate essentially the same set of eigenvalues (or a portion of the eigenvalues are the same). So one pattern signature could represent a group of design patterns, which is part of the reason why the pattern signature is intelligent.

Figure 3:
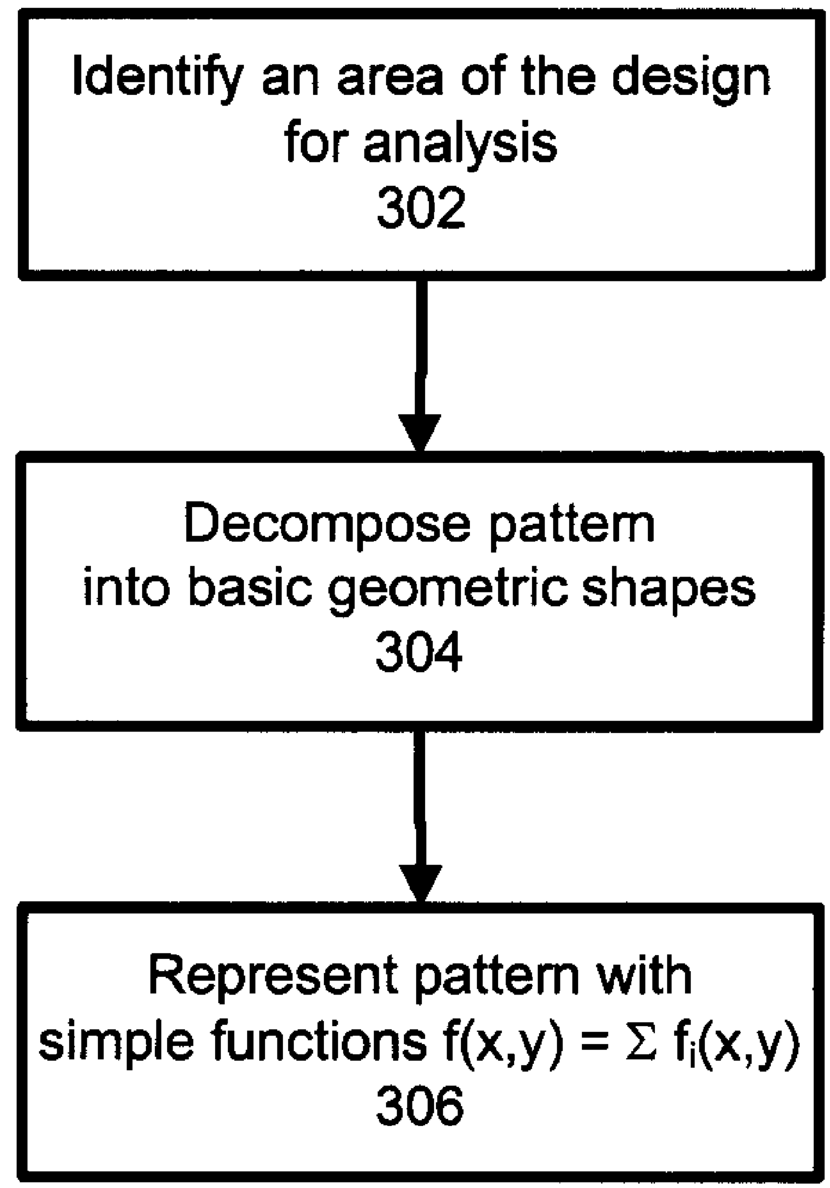
FIG. 3 shows one embodiment of a method for representing patterns by functions.

FIG. 3 shows one embodiment of a method for representing patterns by functions. An area of the IC design is first selected for analysis (302). The size and location of the area depend upon implementation factors such as resolutions of the lithography process and how LPC is conducted. An area of 1 μm×1 μm could be used in some applications. The design pattern in the selected area may be decomposed into basic geometric shapes, such as squares and rectangles (304). In some embodiments, the pattern can be readily represented by the combination of the functions for the basic geometric shapes. Simple functions could be employed to represent the basic geometric shapes (306). Using simple functions makes both function representation and transformation straightforward. The value of the function may be defined as one when the spatial coordinate (x,y) is within the boundary of the shape and zero otherwise. As an example, the function for an square of 120 nm×120 nm with its center located at (50, 70) takes the following form:

$$f_{square}(x, y) = 1, \text{ where } |x-50| \le 60 \text{ and } |y-70| \le 60$$
$$= 0, \text{ where } |x-50| > 60 \text{ or } |y-70| > 60$$

With all the basic geometric shapes that form the pattern being represented by simple functions, the function for the whole pattern is the sum of these simple functions:

$$f(x,y)=\Sigma f_i(x,y).$$

Figure 4:
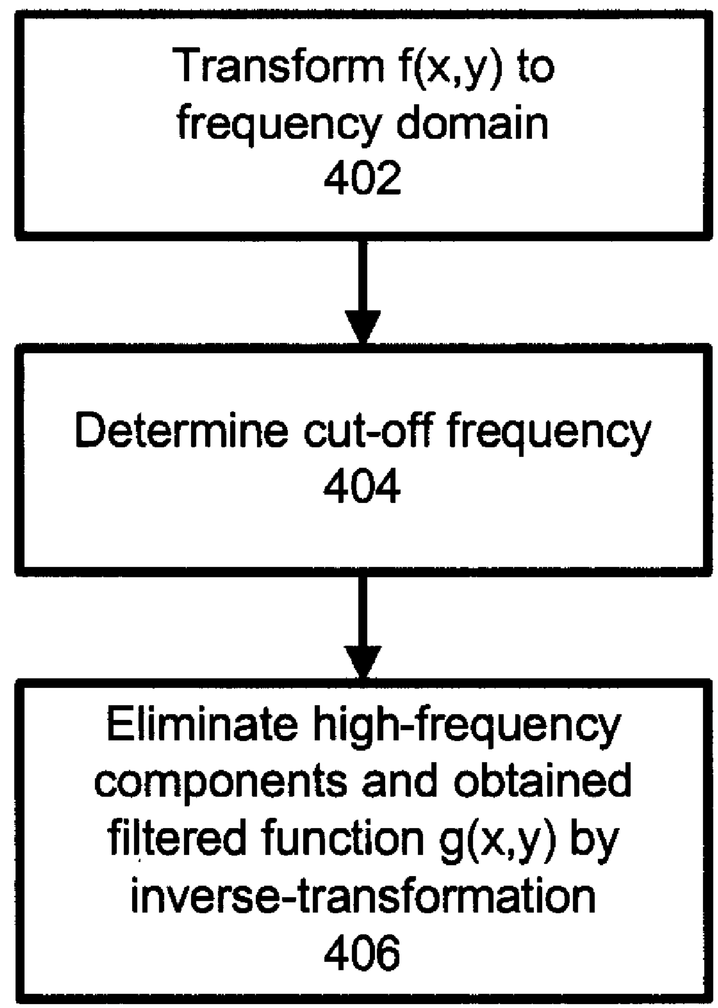
FIG. 4 describes an approach for filtering out unprintable portions of a design pattern, according to one embodiment of the invention.

FIG. 4 describes an approach for filtering out unprintable portions of a design pattern, according to an embodiment of the invention. As discussed above, some geometric details of a design pattern may disappear after a lithography process. For example, sharp corners are often smoothed out. These geometric details usually correspond to high frequency elements of a function that represents the pattern. Fourier and Laplace transformations are examples of standard mathematical approaches that can be used to separate these high frequency elements from the rest of the function. In FIG. 4, the simple functions $f_i(x,y)$ that represent basic geometric shapes are first transformed into a frequency domain (402). The transformation for simple functions could be accomplished by use of the Fourier or Laplace Transformations.

To eliminate high-frequency components, a cut-off frequency is often determined (404). The specific cutoff frequency that is employed depends upon the particular application to which the invention is directed. The higher the cutoff frequency, the more detailed information is retained. For some applications where the resolution of the lithographic system is not high, a low cutoff frequency will suffice. After selecting a cut-off frequency, all the components with frequencies higher than the cutoff frequency may be eliminated and the remaining low-frequency components are inverse-transformed back into the spatial domain as $g_j(x,y)$. If $f_i(x,y)$ represents a rectangle, the derived function $g_j(x,y)$ will describe a shape close to an oval due to the lack of high-frequency components. The filtered function for the whole pattern takes the following form (406):

$$g(x,y)=\Sigma g_i(x,y).$$

Inverse transformation could also be applied directly to the sum of the low-frequency parts of transformed simple functions.

Figure 5:
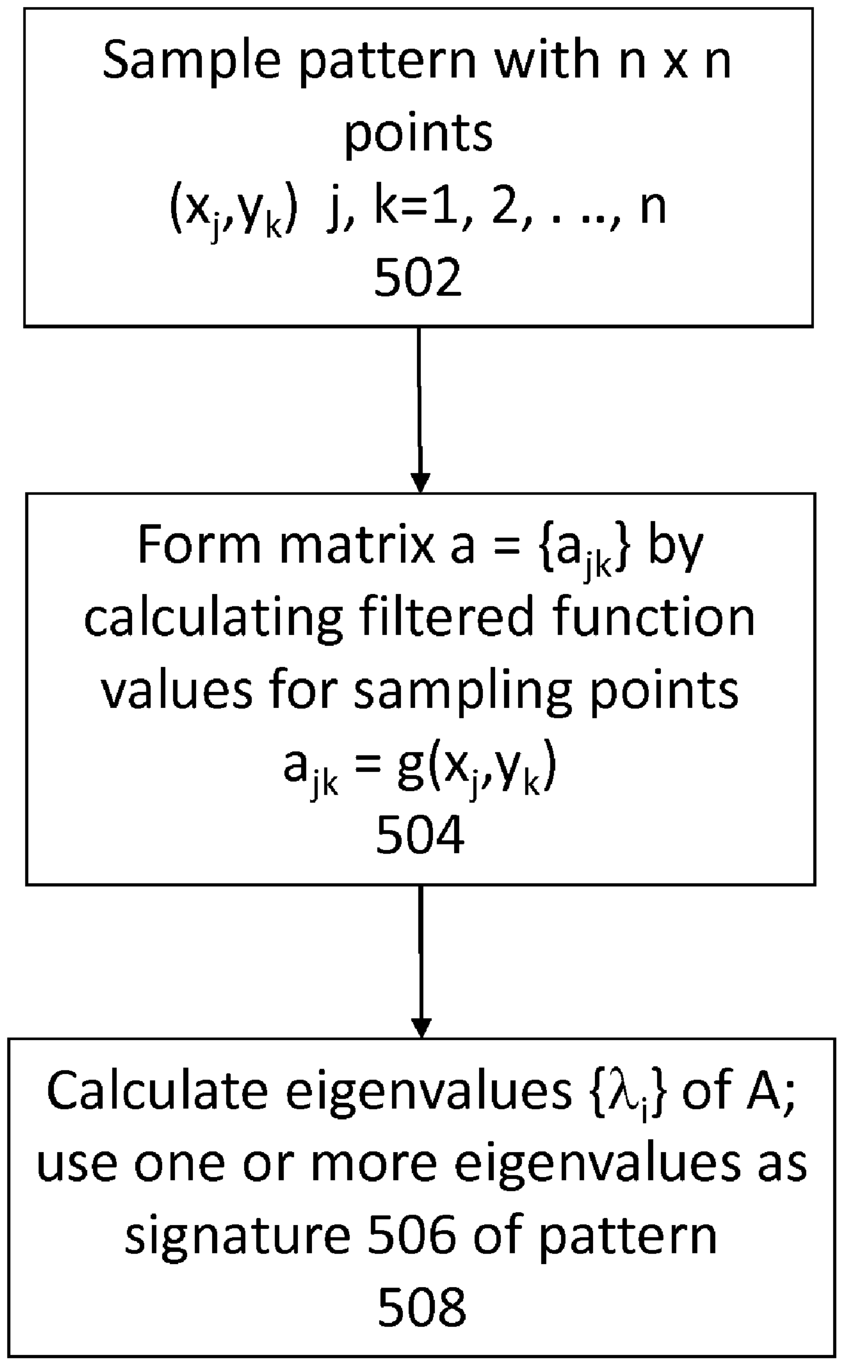
FIG. 5 shows a flowchart of an embodiment of a process for deriving signature for a pattern.

FIG. 5 shows a flowchart of an embodiment of a process for deriving intelligent signature for a pattern. A pattern is first sampled by a set of points (502): $(x_j,y_k)$, j, k=1, 2, . . . n. The number of sampling points (n×n) that is used is dependant upon, among other factors, the resolution of the application. The sampling points can be equally spaced or have high density in the area where there are shapes and low density elsewhere. For example, for an area of 1 μm×1 μm where a pattern is located, a uniform sampling with a spacing of 40 nm would be enough for many applications. Then, the total number of sampling points is 25×25=625.

After sampling the pattern, the filtered function for the pattern is used to construct a matrix (504). The function value $(a_{ik})$ is calculated for each sampling point $(x_j,y_k)$:

$$a_{jk}=g(x_j,y_k)=\Sigma g_i(x_j,y_k).$$

An n×n matrix is then formed:

$$A=\{a_{jk}\}$$

Because A is constructed from the filtered function g(x,y), A will contain information that corresponds mainly to the lithography-printable portions of the pattern.

Using standard approaches, eigenvalues $\{\lambda_i\}$ of A could be calculated. One or more of these eigenvalues may serve as the pattern signature (506). The pattern signature is intelligent because A's eigenvalues, like A, will correlate to the printed pattern after the lithography process. In this way, design patterns that are geometrically different from each other could possibly generate the same set of eigenvalues, or pattern signature.

Pattern matching based on such intelligent pattern signature is more efficient than that based on pattern identifiers that employ direct mathematical representation of design patterns due to its simple form—a set of eigenvalues. Because each set of eigenvalues may serve as a pattern signature for a group of design patterns which are equivalent from a lithography perspective, less lithography simulations will be performed during an IC design process. Due to the same reason, the size of the database that stores verified patterns will be significantly smaller. Furthermore, even if no matched pattern could be found in the database for a new design pattern, there is possibility, in some cases, to find patterns with similar signatures and extrapolate properties of the new pattern from those of verified ones.

System Architecture Overview

In the following description, numerous details are set forth for purpose of explanation. However, one of ordinary skill in the art will realize that various embodiments of the invention may be practiced without the use of these specific details. In other instances, well-known structures and devices are shown in block diagram form in order not to obscure the description of various embodiments of the invention with unnecessary detail.

Figure 6:
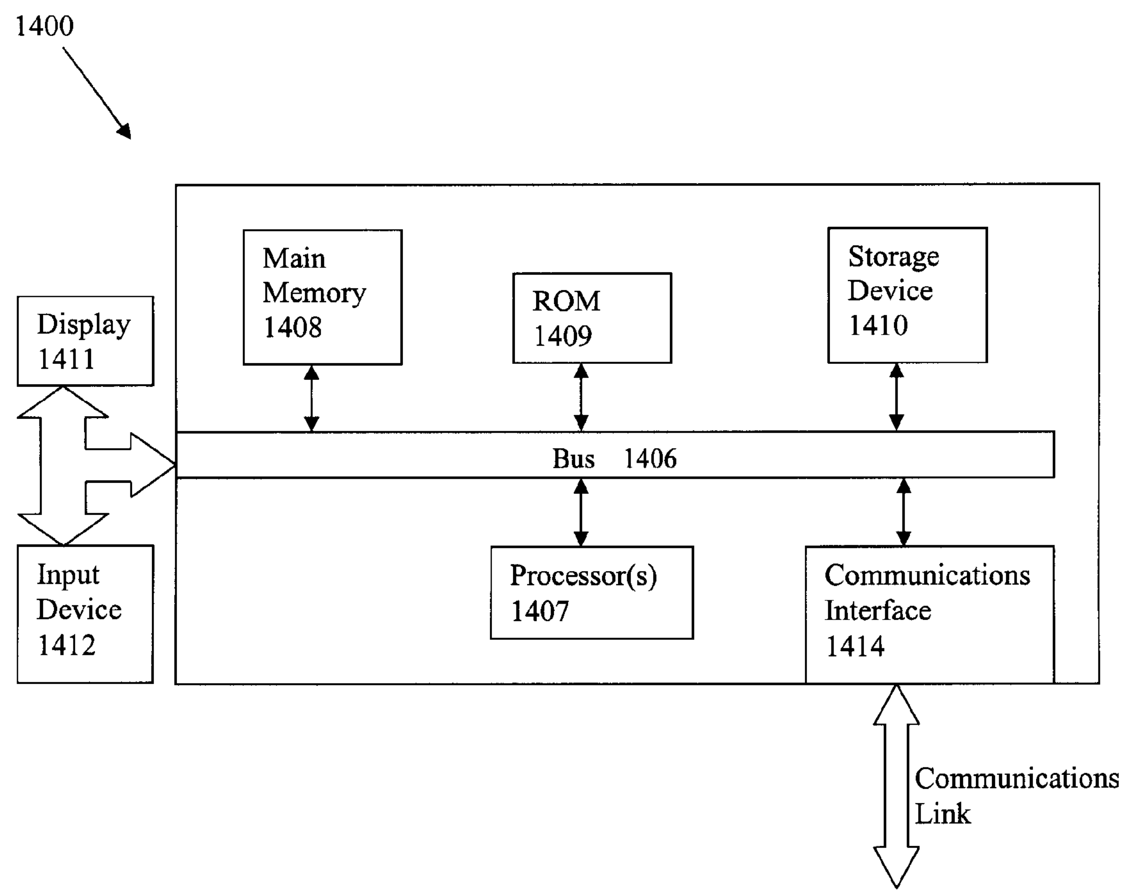
FIG. 6 shows an architecture of an example computing system with which the invention may be implemented.

FIG. 6 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method of storing pattern information in a database comprising:

using at least one processor that is configured or programmed for performing a process, the process comprising:

receiving a request to check whether information of a new pattern needs to be stored in a database, wherein the new pattern is represented by a pattern signature derived according to lithography effects to the new pattern;

comparing the pattern signature representing the new pattern with pattern signatures representing the patterns of which the information is already stored in the database;

storing the information of the new pattern in the database if none of the pattern signatures representing the patterns of which the information is already stored in the database matches the pattern signature representing the new pattern;

associating the pattern signature representing the new pattern with the information of the new pattern stored in the database; and flagging the new pattern if one of the pattern signatures representing the patterns of which the information is already stored in the database matches the pattern signature representing the new pattern.

2. The computer implemented method of claim 1 in which the information of the patterns stored in the database comprises information derived from lithography simulations on the patterns.

3. The computer implemented method of claim 1 embodied as a sequence of instructions stored on a non-transitory computer readable storage medium which is usable by the at least one processor.

4. A method of using pattern signatures to facilitate analyzing information of a pattern, comprising:

using at least one processor that is configured or programmed for performing a process, the process comprising:

receiving a request for analyzing information of a new pattern, wherein the new pattern is represented by a pattern signature derived according to lithography effects to the new pattern;

comparing the pattern signature representing the new pattern with pattern signatures representing patterns of which the information is already known;

generating the information of the new pattern if none of the pattern signatures representing the patterns of which the information is already known matches the pattern signature representing the new pattern, and analyzing the information of the new pattern; and analyzing the information, which is already known, of a pattern if the pattern signature representing the pattern matches the pattern signature representing the new pattern.

5. The computer implemented method of claim 4 in which the information of the new pattern is generated by a use of lithography simulations on the new pattern.

6. The computer implemented method of claim 4 embodied as a sequence of instructions stored on a non-transitory computer readable storage medium which is usable by the at least one processor.

7. A system for storing pattern information in a database, comprising:

at least one processor that is to perform one or more actions, the one or more actions comprising:

receiving a request to check whether information of a new pattern needs to be stored in a database, wherein the new pattern is represented by a pattern signature derived according to lithography effects to the new pattern;

comparing the pattern signature representing the new pattern with pattern signatures representing patterns of which the information is already stored in the database;

storing the information of the new pattern in the database if none of the pattern signatures representing the patterns of which the information is already stored in the database matches the pattern signature representing the new pattern;

associating the pattern signature representing the new pattern with the information of the new pattern stored in the database; and flagging the new pattern if one of the pattern signatures representing the patterns of which the information is already stored in the database matches the pattern signature representing the new pattern.

8. The system of claim 7, in which the information of the patterns stored in the database comprises information derived from lithography simulations on the patterns.

9. A system for using pattern signatures to facilitate analyzing information of a pattern, comprising:

at least one processor that is to perform one or more actions, the one or more actions comprising:

receiving a request for analyzing information of a new pattern, wherein the new pattern is represented by a pattern signature derived according to lithography effects to the new pattern;

comparing the pattern signature representing the new pattern with pattern signatures representing patterns of which the information is already known;

generating the information of the new pattern if none of the pattern signatures representing the patterns of which the information is already known matches the pattern signature representing the new pattern, and analyzing the information of the new pattern; and analyzing the information, which is already known, of a pattern if a first pattern signature representing the pattern matches the pattern signature representing the new pattern.

10. The system of claim 9, in which the information of the new pattern is generated by a use of lithography simulations on the new pattern.

* * * * *